United States Patent
Lai et al.

(10) Patent No.: US 7,820,997 B2
(45) Date of Patent: Oct. 26, 2010

(54) RESISTOR RANDOM ACCESS MEMORY CELL WITH REDUCED ACTIVE AREA AND REDUCED CONTACT AREAS

(75) Inventors: Erh Kun Lai, Longjing Shiang (TW); Chia Hua Ho, Kaoshing (TW); Kuang Yeu Hsieh, Kaoshing (TW)

(73) Assignee: Macronix International Co., Ltd., Hsinchu (TW)

( * ) Notice: Subject to any disclaimer, the term of this patent is extended or adjusted under 35 U.S.C. 154(b) by 549 days.

(21) Appl. No.: 11/421,042

(22) Filed: May 30, 2006

(65) Prior Publication Data
US 2007/0281420 A1 Dec. 6, 2007

(51) Int. Cl.
*H01L 47/00* (2006.01)
(52) U.S. Cl. .................. 257/4; 257/2; 257/758; 257/773; 257/776; 257/E31.029
(58) Field of Classification Search .......... 257/758, 257/774, 773, 775, 776, 781, 786, E23.013, 257/E31.029, 2, 4, 5; 438/95
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,567 A | 1/1993 | Klersy et al. |
| 5,472,887 A | 12/1995 | Hutter et al. |
| 5,534,712 A | 7/1996 | Ovshinsky et al. |
| 5,687,112 A | 11/1997 | Ovshinsky |
| 5,789,277 A | 8/1998 | Zahorik et al. |

(Continued)

FOREIGN PATENT DOCUMENTS

WO  WO 00/45108 A1  8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Matthew E Warren
(74) *Attorney, Agent, or Firm*—Haynes Beffell & Wolfeld LLP

(57) ABSTRACT

A memory device has a sidewall insulating member with a sidewall insulating member length according to a first spacer layer thickness. A first electrode formed from a second spacer layer having a first electrode length according to a thickness of a second spacer layer and a second electrode formed from the second spacer layer having a second electrode length according to the thickness of the second spacer layer are formed on sidewalls of the sidewall insulating member. A bridge of memory material having a bridge width extends from a top surface of the first electrode to a top surface of the second electrode across a top surface of the sidewall insulating member, wherein the bridge comprises memory material.

19 Claims, 12 Drawing Sheets

U.S. PATENT DOCUMENTS

| | | |
|---|---|---|
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,271,577 B1 * | 8/2001 | Havemann ................. 257/592 |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 * | 1/2003 | Lowrey et al. .............. 438/128 |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,969,866 B1 * | 11/2005 | Lowrey et al. ................. 257/3 |
| 6,992,932 B2 | 1/2006 | Cohen |
| 7,227,171 B2 * | 6/2007 | Bez et al. ........................ 257/3 |
| 7,414,258 B2 * | 8/2008 | Lung et al. ..................... 257/4 |
| 2003/0122156 A1 * | 7/2003 | Maimon .................... 257/200 |
| 2004/0248339 A1 | 12/2004 | Lung |
| 2005/0215009 A1 | 9/2005 | Cho |
| 2006/0284279 A1 * | 12/2006 | Lung et al. .................. 257/528 |
| 2006/0286709 A1 | 12/2006 | Lung et al. |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 µm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel pTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

RESISTOR RANDOM ACCESS MEMORY CELL WITH REDUCED ACTIVE AREA AND REDUCED CONTACT AREAS

CROSS-REFERENCE TO RELATED APPLICATIONS

This application is related to our co-pending U.S. application Ser. No. 11/421,036 filed on the same day as the present application and owned by the same assignee.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure which are compatible with manufacturing of peripheral circuits on the same integrated circuit.

SUMMARY OF THE INVENTION

A phase change random access memory PCRAM device is described suitable for use in large-scale integrated circuits. Technology described herein includes a memory device which has a sidewall insulating member with a sidewall insulating member length according to a first spacer layer thickness. A first electrode formed from a second spacer layer having a first electrode length according to a thickness of a second spacer layer and a second electrode formed from the second spacer layer having a second electrode length according to the thickness of the second spacer layer are formed on sidewalls of the sidewall insulating member. A bridge of memory material having a bridge width extends from a top surface of the first electrode to a top surface of the second electrode across a top surface of the sidewall insulating member, wherein the bridge comprises memory material.

The inter-electrode path across the insulating wall formed by the sidewall insulating member between the first and second electrodes, has a path length defined essentially by the thickness of the first spacer layer. The bridge comprises a programmable resistive material. For the phase change memory, the bridge comprises memory material having at least two solid phases that are reversible, such as a chalcogenide-based material or other related material, by applying a current through the material or applying a voltage across the first and second electrodes.

The active volume of memory material subject of programmable resistance can be very small. For the purpose of this disclosure, when referring to the dimensions of the structures in the cell, the "length" refers to the distance in the x-direction (left to right in FIG. 1), which for the sidewall insulating member and the sidewall electrodes, is determined by the thicknesses of the spacer layers used to form the sidewalls. The "thickness" of a structure in the cell refers to distance in the y-direction (up and down in FIG. 1), and the "width" refers to distance in the z-direction (perpendicular to the plane of the drawing in FIG. 1). Thus the active volume of memory material is determined by the length of the sidewall insulating member (x-direction), the thickness of the thin film used to form the bridge (y-direction), the width of the bridge orthogonal to the conductive path length (z-direction), and the length of the side wall electrode structures (x-direction) acting as contacts to the bridge. The small contact areas, defined by the lengths of the first and second electrodes and the width of the bridge, improve thermal isolation of the bridge by reducing the area of contact to the electrode material which has relatively high thermal conductivity. The small contact areas also serve to concentrate current flow, increasing current density in the bridge. The improved thermal isolation and increased current density improve reset operation of the cell, particularly for cells comprising bridges of phase change material.

The length of the side wall electrode structures and the thickness of the thin film of memory material used to form the bridge are determined in embodiments of the technology by thin film thicknesses which are not limited by the lithographic processes used in manufacturing the memory cell. Optionally, the width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the more narrow pattern onto the layer of insulating material on memory material. Also, other techniques can be used to form narrow lines of material in a layer on an integrated circuit. Accordingly, a phase change memory cell with simple structure achieves very small reset current and low power consumption, and is easily manufactured.

In some embodiments of the technology described herein, an array of memory cells is provided. In the array, a plurality of electrode members and sidewall insulating members therebetween comprise a planarized interface in an integrated circuit. The corresponding plurality of thin film bridges across the insulating walls between pairs of electrode members comprises memory elements on the top surfaces of the electrode layer and sidewall insulating members. A current path from a first electrode in the electrode layer through a thin film bridge on the top surface of the sidewall insulating member to a second electrode in the electrode layer is established for memory cells in the array.

Circuitry below the electrode layer on integrated circuits described herein can be implemented using well understood technology for logic circuitry and memory array circuitry, such as CMOS technology.

Also, in one array embodiment described herein, circuitry above the electrode layer includes a plurality of bit lines. In an embodiment having bit lines above the electrode layer that is described herein, electrode members in the electrode layer which act as a first electrode for a memory cell are shared so that a single electrode member provides a first electrode for two memory cells in a column of the array. Also, in an embodiment that is described herein, bit lines in the plurality of bit lines are arranged along corresponding columns in the array, and two adjacent memory cells in the corresponding columns share a contact structure for contacting said first electrodes.

A method for manufacturing a memory device is also described. An embodiment of the method comprises forming a sacrificial layer of sacrificial material on a wafer that has been processed to provide access transistors and access paths (e.g. tungsten plugs surrounded by inter-metal dielectric ("IMD")) coupled to the sacrificial material. The sacrificial layer is patterned to form one or more sacrificial members, and a first spacer layer comprising dielectric material is formed over the sacrificial members and on sidewalls of the sacrificial members. A portion of the first spacer layer is removed to form sidewall insulating members on the sidewalls of the sacrificial members. The sacrificial members are removed, leaving cavities where the sacrificial members previously were. A second spacer layer comprising electrically conductive material is formed over the sidewall insulating members and on both sidewalls of the sidewall insulating member. An IMD layer is formed over the second spacer layer and planarized to expose the second spacer layer and the sidewall insulating members, forming pairs of first and second sidewall electrodes separated by the sidewall insulating members. A bridge of memory material is formed between the first sidewall electrode and the second sidewall electrode across the sidewall insulating member. The bridge is generally a patch of memory material contacting the first sidewall electrode and second sidewall electrode to define an inter-electrode path between the first sidewall electrode and second sidewall electrode across the sidewall insulating member having a path length defined by a thickness of the first spacer layer.

Other aspects and advantages of the invention are described below with reference to the figures.

DETAILED DESCRIPTION

A detailed description of thin film fuse phase change memory cells, arrays of such memory cells, and methods for manufacturing such memory cells, is provided with reference to FIGS. 1-19.

Figure 1:
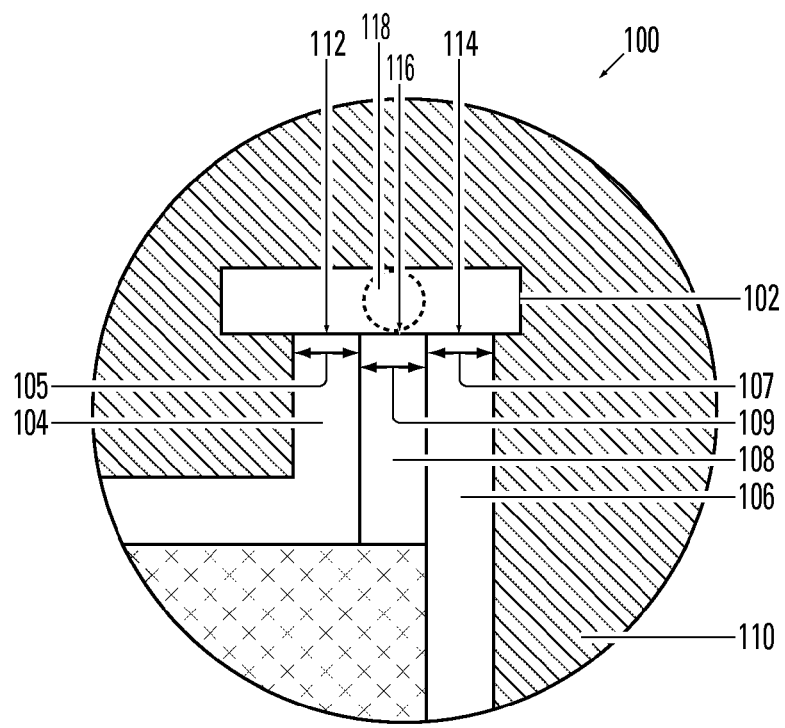
FIG. 1 illustrates an embodiment of a thin film bridge phase change memory device.

FIG. 1 illustrates a basic structure of a memory device 100 including a bridge 102 of memory material, such as programmable resistive material on sidewalls of an electrode layer (see FIG. 10, ref. num. 200), which comprises a first electrode 104 having a first electrode length, represented by a double-ended arrow 105, a second electrode 106 having a second electrode length, represented by a double-ended arrow 107, and a sidewall insulating member 108 between the first electrode 104 and the second electrode 106 having a sidewall insulating member length, represented by a double arrow 109. The first electrode length is typically, but not necessarily, essentially the same as the second electrode length, both of which are determined by the thickness of the electrode layer. Similarly, the length 109 of the sidewall insulating member is determined by the thickness of an insulating layer (see FIG. 7, ref. num. 186) that is deposited to form a sidewall (see FIG. 8A, ref. nos. 192, 194) on a sacrificial structure (see FIG. 8A, ref. nos. 178, 180) that is later removed to allow formation of sidewall electrodes (namely electrodes 104, 106) on both sides of the sidewall insulating member.

The first and second electrodes and the sidewall insulating member comprise thin film sidewall structures. Insulating fill 110 is adjacent to the sidewall structures, and provides for planarization of the top surface for support of subsequent conductor layers (see FIG. 17). As illustrated, the first and second electrodes 104, 106 have top surfaces 112, 114 that contact the bridge 102 at electrode contact areas, which are essentially the areas defined by the width of the bridge (see FIG. 13B, ref. num. 214) and the lengths 105, 107 of the electrodes. The lengths of the electrodes are defined by the thickness of the electrode layer (see FIG. 10, ref. num. 200). Likewise, the sidewall insulating member 108 has a top surface 116, and the bridge 102 has an active region 118, represented by a dashed line, generally the length 109 of the sidewall insulating member 108. The active region 118 of the bridge 102 represents the active volume of memory material that switches states during programming and resetting of the memory. The bridge 102 of memory material lies on the planar top surface 112, 114 of the electrode layer, and the planar top surface 116 of the sidewall insulating member 108 so that contacts between the first electrode 104 and the bridge 102 and between the second electrode 106 and the bridge 102 are made on the bottom side of the bridge.

The active volume of memory material subject of programmable resistance (i.e. active region 118) can be very small, determined by the length of the sidewall insulating member, which results from the deposited layer thickness and etch process. In a particular embodiment, the sidewall insulating member is a ring of dielectric material deposited on the sidewall of a plug, or pillar, of sacrificial material, and is formed similarly to gate sidewalls, which are well known in the art of metal-oxide-semiconductor field-effect transistor fabrication. The length of the electrode structures, which are also formed using sidewall techniques, the length of the sidewall insulating member, and the thickness of the layer of memory material used to form the bridge 102 are determined in embodiments of the technology by thin film thicknesses, and are not limited by the minimum feature size F of photolithographic processes used in manufacturing the memory cell. In a particular embodiment, the width of the bridge (see FIG. 13B, ref. num. 214) is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the narrowed pattern onto the layer of memory material. Also, other techniques can be used to form narrow lines of material in a layer on an integrated circuit. Accordingly, a phase change memory cell with simple structure achieves very small reset current and low power consumption, and is easily manufactured.

In operation, a current path ("inter-electrode path") from the first electrode 104, through the active region 118 of the bridge 102, to the second electrode 106 is formed by the memory cell structure. Access circuitry can be implemented to contact the first electrode 104 and the second electrode 106 in a variety of configurations for controlling the operation of the memory cell, so that it can be programmed to set the bridge 102 with a programmable resistance to indicate a data value. For example, using a chalcogenide-based phase change memory material, the memory cell may be set to a relatively high resistivity state in which at least a portion of the bridge in the current path is in an amorphous state, and a relatively low resistivity state, in which all or most of the bridge in the current path is in a crystalline state.

The active region 118 of the cell 100 is the region for a phase change memory cell embodiment in which the material is induced to change between the at least two solid phases. As can be appreciated, the active region 118 can be made extremely small in the illustrated structure, reducing the magnitude of current needed to induce the phase changes.

Embodiments of the memory cell include phase change based memory materials, including chalcogenide based materials and other materials, for the bridge 102. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE v.* 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. CeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to 600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

Figure 2A:
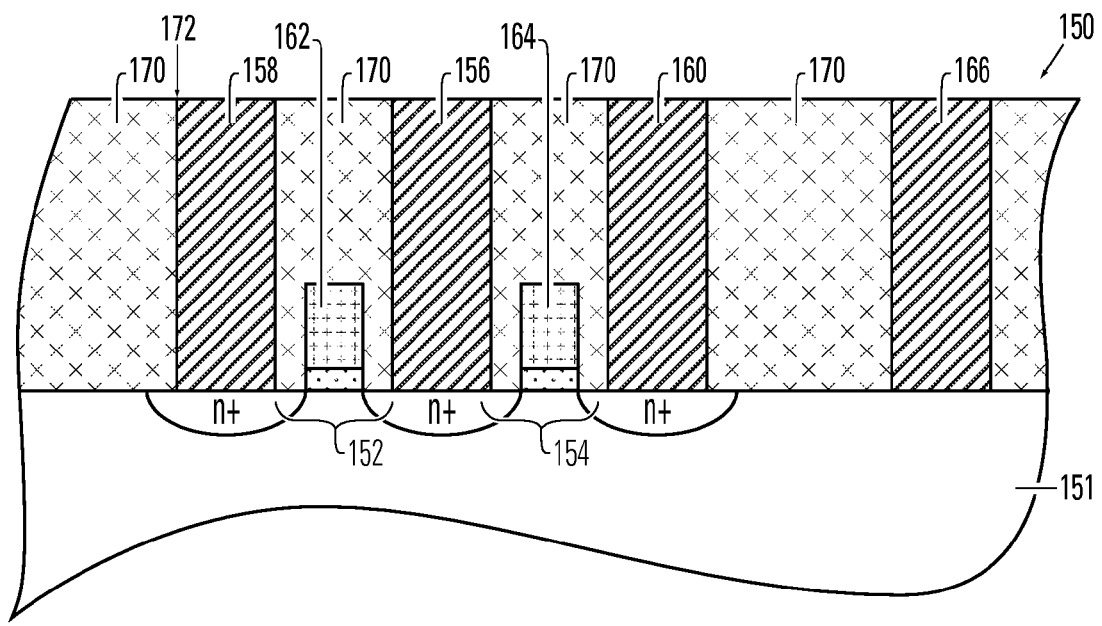
FIG. 2 through FIG. 17 are cross sections illustrating a fabrication sequence of a memory array including memory cells having thermally isolating gaps according to an embodiment of the invention.

FIG. 2A is a cross section of a portion of an integrated circuit ("IC") 150 fabricated on a substrate 151, such as a silicon wafer, having a partially fabricated memory array according to an embodiment. First and second transistors 152, 154, which in some applications are commonly referred to as "access transistors," have a common source contact 156, a first drain contact 158, and a second drain contact 160, which in a particular embodiment are all tungsten plugs coupled to n+ doped regions in the substrate, but are alternatively other metals or other conductors, such as doped silicon or silicide, or combinations of conductive materials.

Gates 162, 164 form conductive channels electrically coupling the source contact 156 and drain contacts 158, 160 according to electronic signals applied to the gates, as is well understood in the art of field-effect transistor operation. A peripheral contact 166 is similar to the other plugs. Insulating material 170 separates the contacts 156, 158, 160, 166 and gates 162, 164 and the insulating material and plugs have been planarized to form a surface 172 suitable for subsequent processing steps, as is well known in the art of IC fabrication. In a particular embodiment, the IC has been processed to this stage using conventional CMOS fabrication techniques, which may include additional features that are omitted for simplicity and clarity of illustration.

Figure 2B:
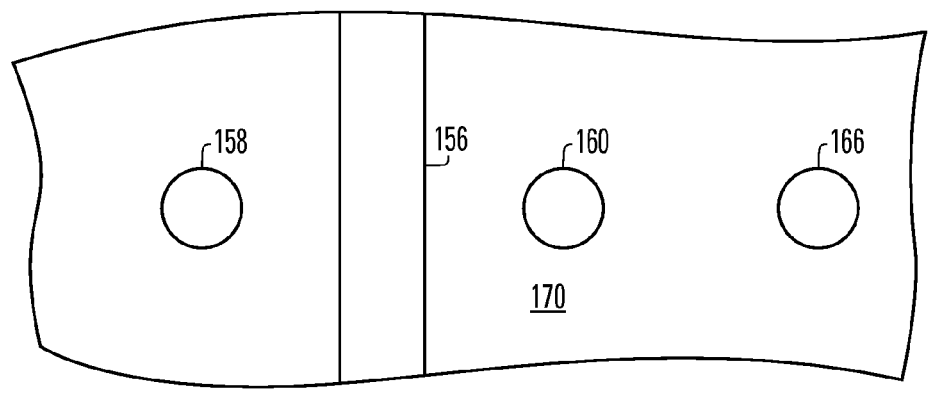

FIG. 2B is a plan view of the portion of the integrated circuit of FIG. 2A showing the contacts 156, 158, 160, 166 surrounded by the insulating material 170.

Figure 3:
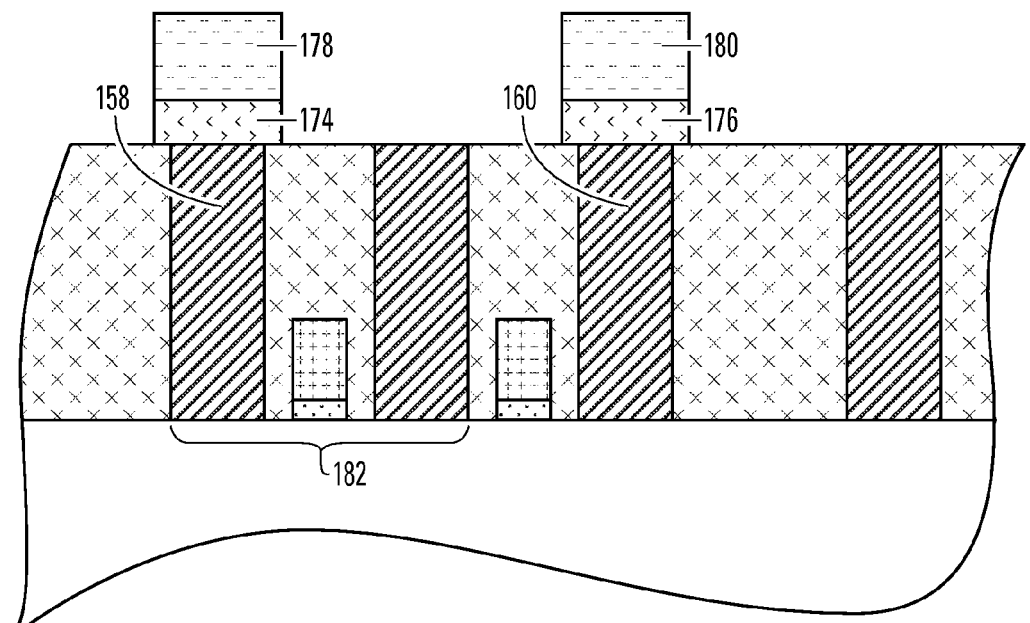

FIG. 3 is a cross section of the portion of the integrated circuit of FIG. 2A with conductor portions 174, 176 formed on the drain plugs 158, 160. The material used for the conductor portions is chosen for compatibility with the material of the plugs 158, 160 and the material of the sidewall electrodes as described below. In alternative embodiments, the conductor portions 174, 176 can be eliminated where contact to the plugs by the sidewall electrodes can be reliably established. An array 182 is formed from the two transistors (see FIG. 2A, ref. nos. 152, 154), and typically other transistors and memory cells (not shown) of the IC. The conductor portions 174, 176 are formed from a layer of conductive material using photolithographic techniques. In a particular embodiment using tungsten for the plugs 158, 160, the conductor portions 174, 176 are TiN or TiN/Al/TiN, or other conductive materials. The conductor portions are typically about 50 nm to about 200 nm thick and have a diameter determined by the feature sizes for plugs or pillars that can be accomplished by the manufacturing technologies used. For representative photolithographic technologies, the conductor portions can be about 90 nm in diameter; however, these values are merely exemplary.

Sacrificial portions 178, 180 are formed from a layer of sacrificial material, which will be etched away in a later step to form cavities (see FIG. 9, ref. num. 196, 198). The sacrificial portions 178, 180 have a cylindrical shape with a circular or near circular cross-section in a representative embodiment with a maximum radius near the radius of the corresponding contact plugs 158, 160, and aligned within lithographic process tolerances with corresponding contact plugs 158, 160. For example, in embodiments where the contact plugs have a diameter near 200 nm, the diameter of the sacrificial portions may be in a range of about 200 to 300 nm, and can be defined using the same lithographic step used to define the conductor portions 174, 176. In other embodiments, the cross-section of the cylindrical shape of the sacrificial portions can be square, rectangular or irregularly shaped, depending on the process used for patterning the sacrificial portions. In a particular embodiment, the sacrificial members 178, 180 are formed from a layer of polysilicon material, and the patterned conductor portions and the sacrificial members are patterned using the same photoresist mask (not shown). The sacrificial members are typically about 20 nm to about 100 nm thick and about 200 nm in diameter; however, these values are merely exemplary. Furthermore, the conductor and sacrificial members do not have to be cylindrical, or even the same shape.

Figure 4:
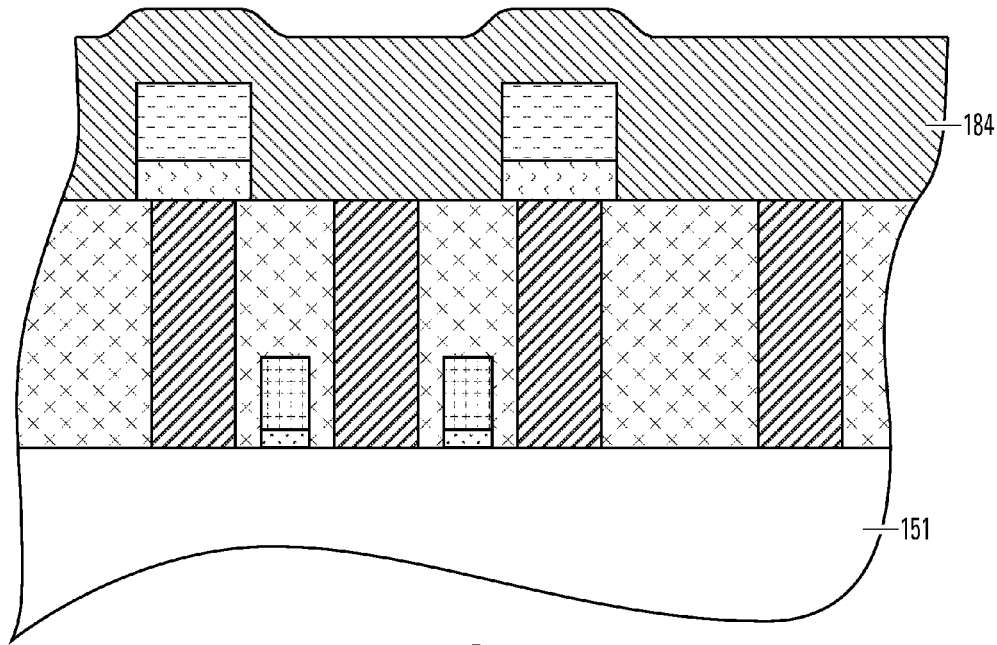

FIG. 4 is a cross section of the portion of the integrated circuit of FIG. 3 with a layer of dielectric material 184 deposited over the substrate 151. This layer of dielectric material is commonly referred to as an inter-metallic dielectric ("IMD") layer. In a particular embodiment, the layer of dielectric material 184 comprises silicon dioxide.

Figure 5:
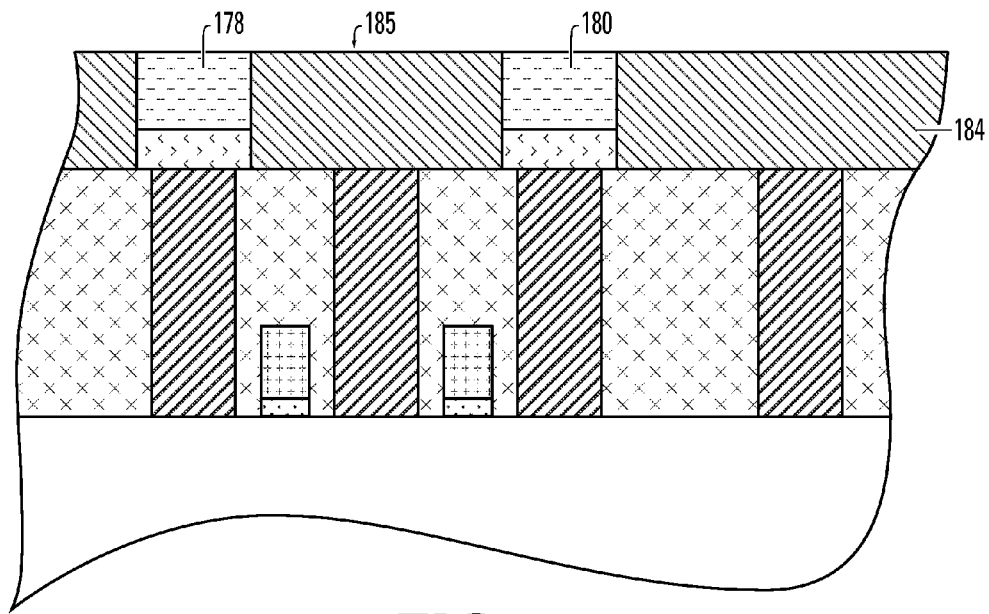

FIG. 5 is a cross section of the portion of the integrated circuit of FIG. 4 after a chemical-mechanical polishing ("CMP") step that forms a planarized surface 185 of the layer of dielectric material 184 and exposes (and optionally planarizes) the sacrificial members 178, 180. In a particular embodiment, the sacrificial members are polysilicon, and the end-point catch of the CMP process occurs when polysilicon is detected, or shortly thereafter.

Figure 6:
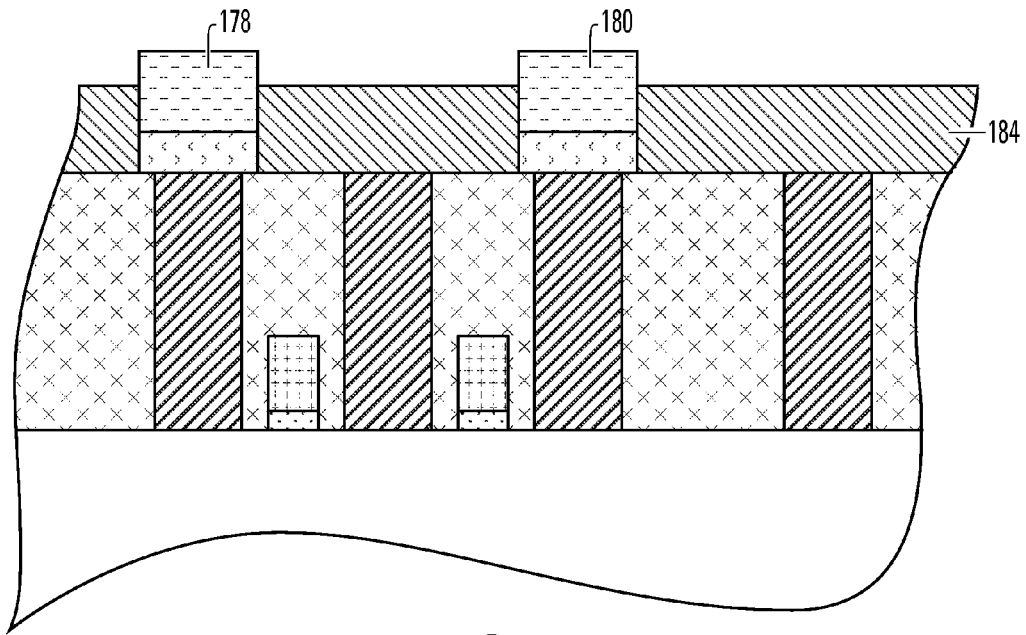

FIG. 6 is a cross section of the portion of the integrated circuit of FIG. 5 after the thickness of the layer of dielectric material 184 has been reduced below the tops of the sacrificial members 178, 180. In a particular embodiment, a hydrofluoric-based wet chemical ("dip") etch is used to selectively remove some of the dielectric layer material (e.g. silicon dioxide). Other etch techniques are alternatively used to lower the layer of dielectric material. In an exemplary embodiment, the sacrificial members are about 100 nm thick, and the dielectric layer is lowered about 100 nm from the tops of the sacrificial members.

Figure 7:
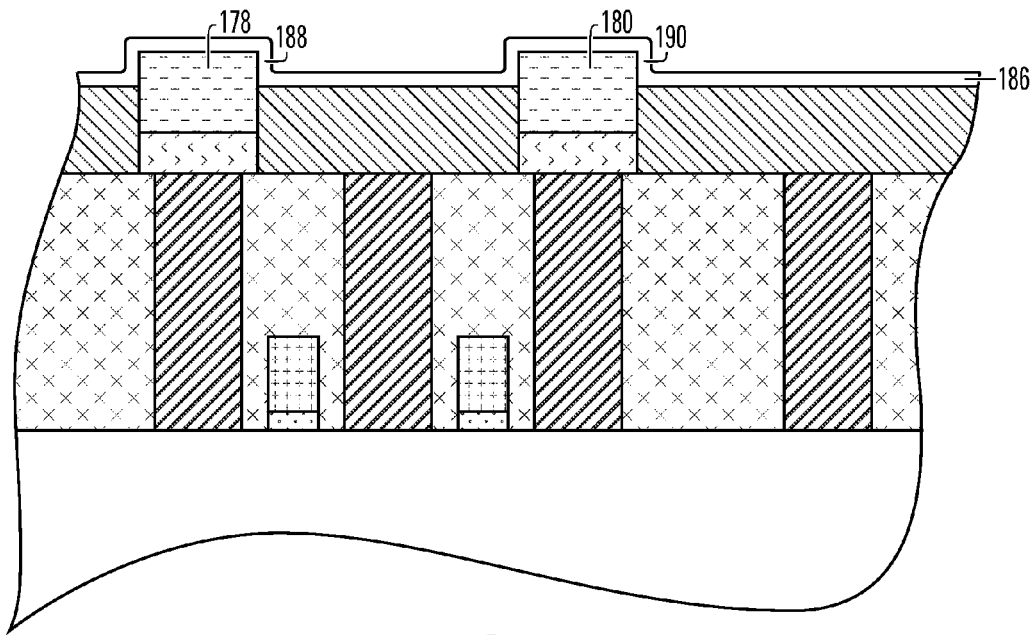

FIG. 7 is a cross section of the portion of the integrated circuit of FIG. 6 with a first spacer layer 186. The first spacer layer conforms to the sidewalls 188, 190 of the sacrificial members 178, 180 formed by the etch-back described in reference to FIG. 6. In a particular embodiment, the first spacer layer is a layer of silicon nitride about 20 nm to about 30 nm thick, which will result in a very short sidewall insulating member length (see FIG. 1, ref. num. 109). The term "spacer layer" is used to indicate that it will be processed into structures, namely insulating members and electrodes, that are similar to what are commonly called "gate sidewall spacers" in the art of field-effect transistor fabrication. They are similar in that they are formed on the sidewalls of a member.

Figure 8A:
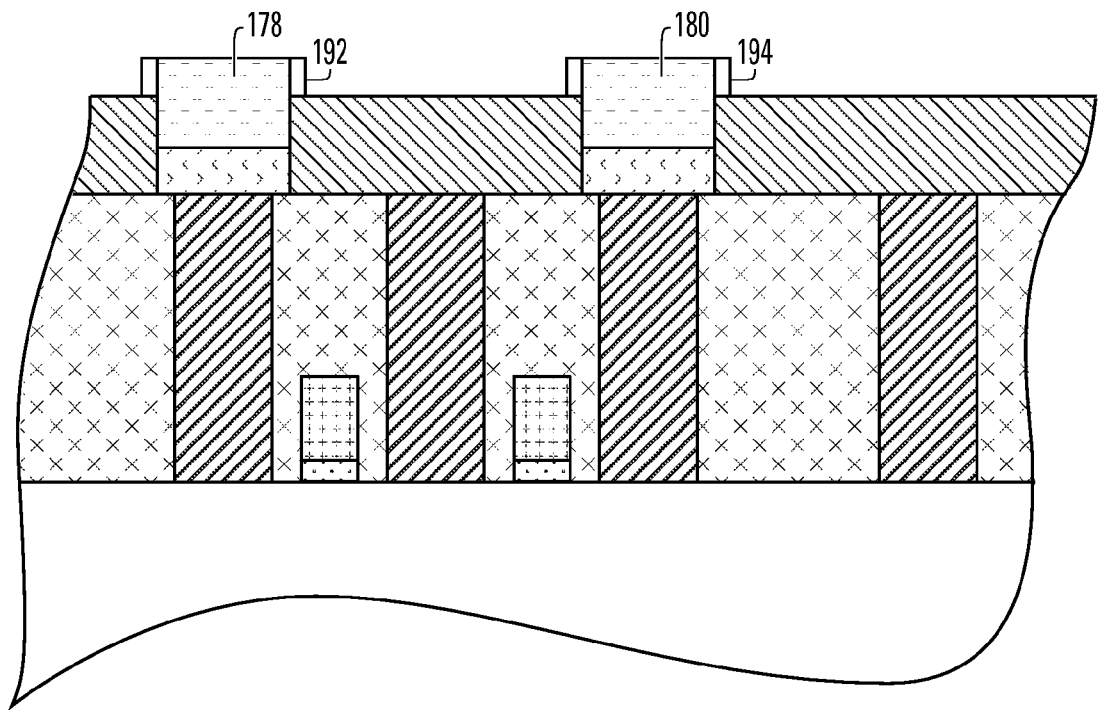

FIG. 8A is a cross section of the portion of the integrated circuit of FIG. 7 after forming first sidewall members 192, 194 on the sidewalls of the sacrificial members 178, 180. Generally, an anisotropic (directional) etch, such as a capacitively coupled plasma etch, is used to remove the field of the first spacer layer, leaving the first sidewall members on the sidewalls. Sidewall spacer formation is well known in the art of field-effect-transistor ("FET") fabrication, and a more detailed explanation is therefore omitted. Some thinning of the spacer layer may occur during the formation of the sidewall members, but the length of the resulting sidewall insulating member (see FIG. 1, ref. num. 109) is generally determined according to the thickness of the first spacer layer. In other words, a thicker spacer layer results in a longer sidewall. In some embodiments, a spacer layer is optionally etched before or during sidewall member formation to reduce the length of the resulting sidewall member.

Figure 8B:
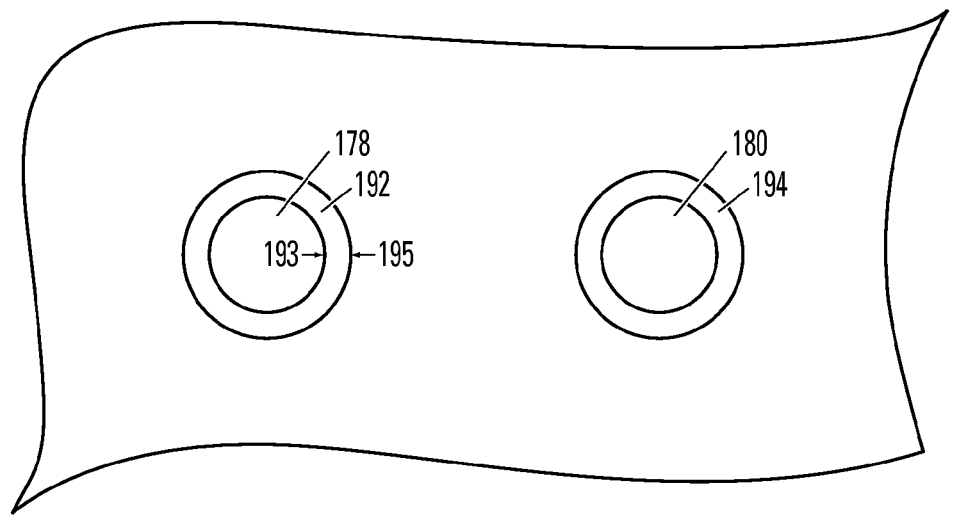

FIG. 8B is a plan view of portion of the integrated circuit of FIG. 8A showing the first sidewall members 192, 194 surrounding the sacrificial members 178, 180. The sidewall member 192 comprises a dielectric (electrically insulating) material, and has a first insulating member sidewall 193 and a second insulating member sidewall 195.

Figure 9:
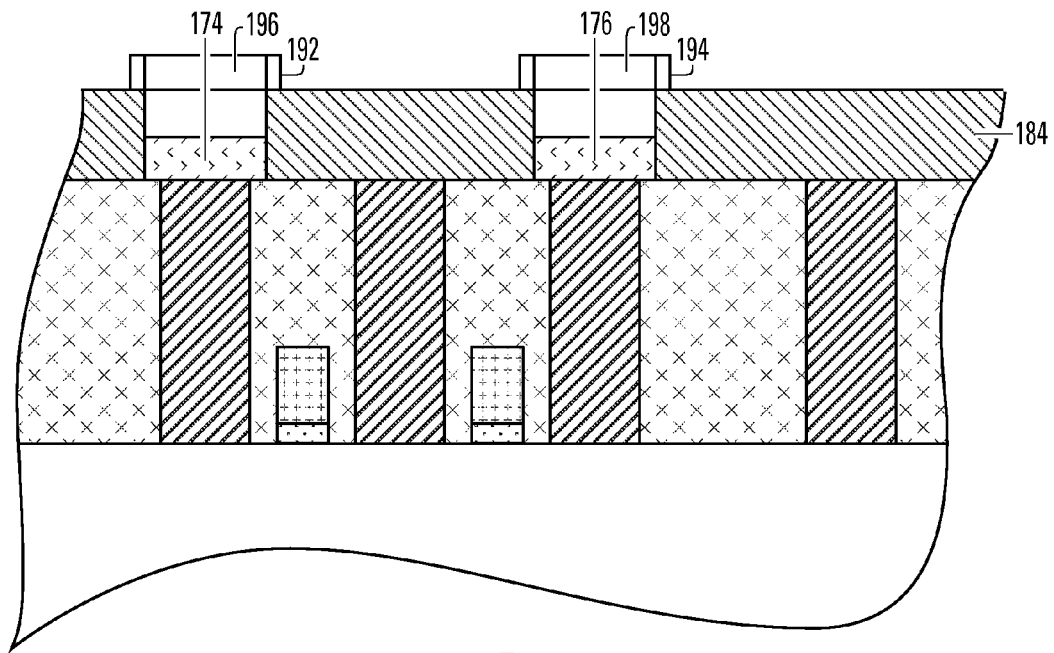

FIG. 9 is a cross section of the portion of the integrated circuit of FIG. 8A after removing the sacrificial members (see FIG. 8A, ref. nos. 178, 180), leaving cavities 196, 198 extending through the first sidewall members 192, 194 and dielectric layer 184 to the conductor portions 174, 176.

Figure 10:
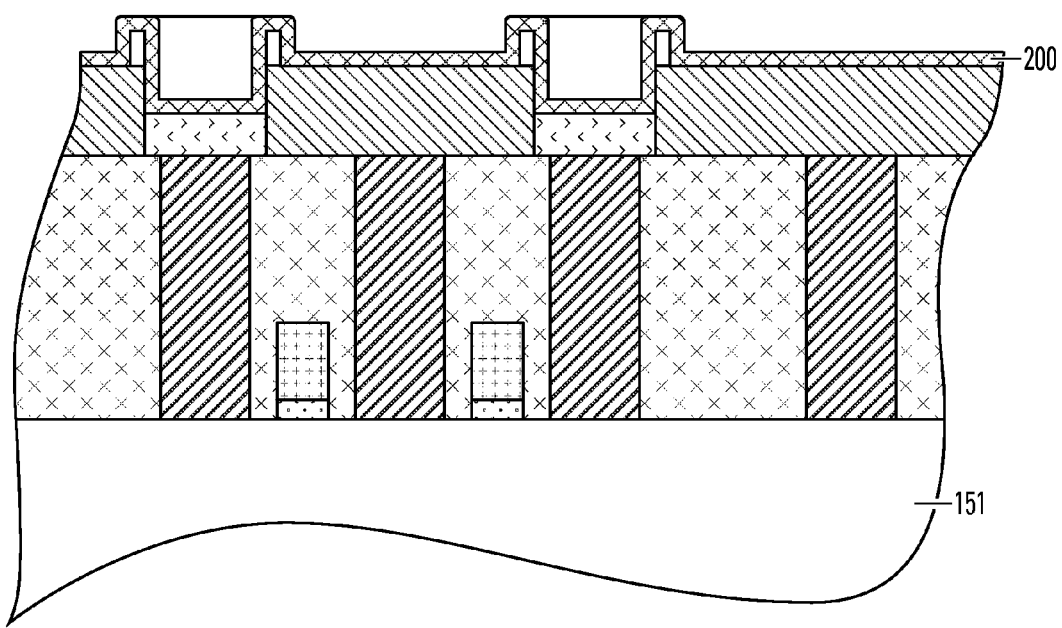

FIG. 10 is a cross section of the portion of the integrated circuit of FIG. 9 with a layer of second spacer material 200 deposited over the substrate 151. The layer of second spacer material will be processed to form first and second electrodes of a memory cell (see, e.g., FIG. 1, ref. nos. 104, 106). The material of the second spacer material is selected for compatibility with the memory material and the conductive portions 174, 176. In a particular embodiment in which the memory material comprises GST, the layer of second spacer material 200 comprises TiN about 5 nm thick to about 30 nm thick, and in a more particular embodiment, is about 10 nm thick, which provides a desirably small contact area with an overlying bridge of memory material (see FIG. 1, ref. num. 102).

Figure 11:
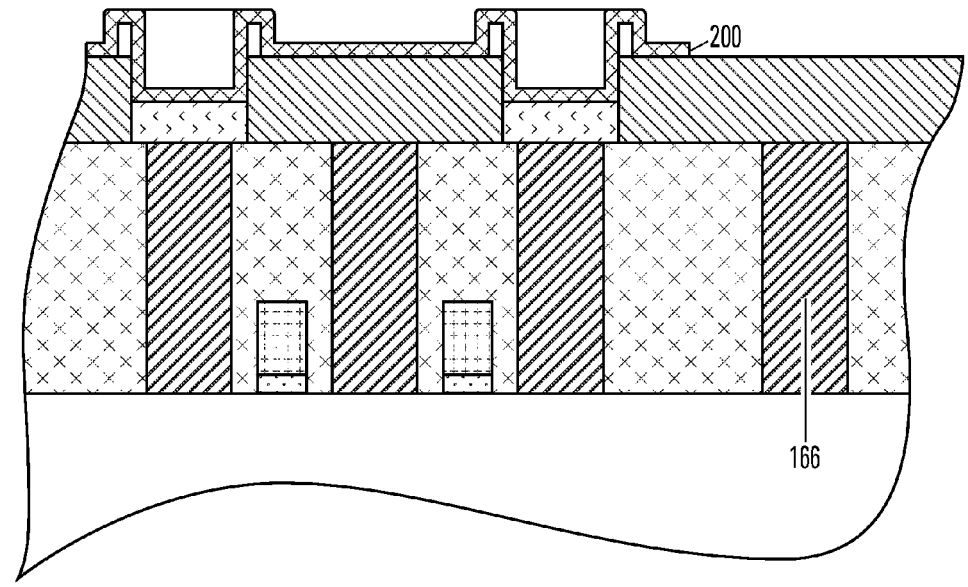

FIG. 11 is a cross section of the portion of the integrated circuit of FIG. 10 after the layer of second spacer material 200 has been patterned using a photolithographic technique. The second spacer layer has been removed so that it does not cover the peripheral plug 166.

Figure 12:
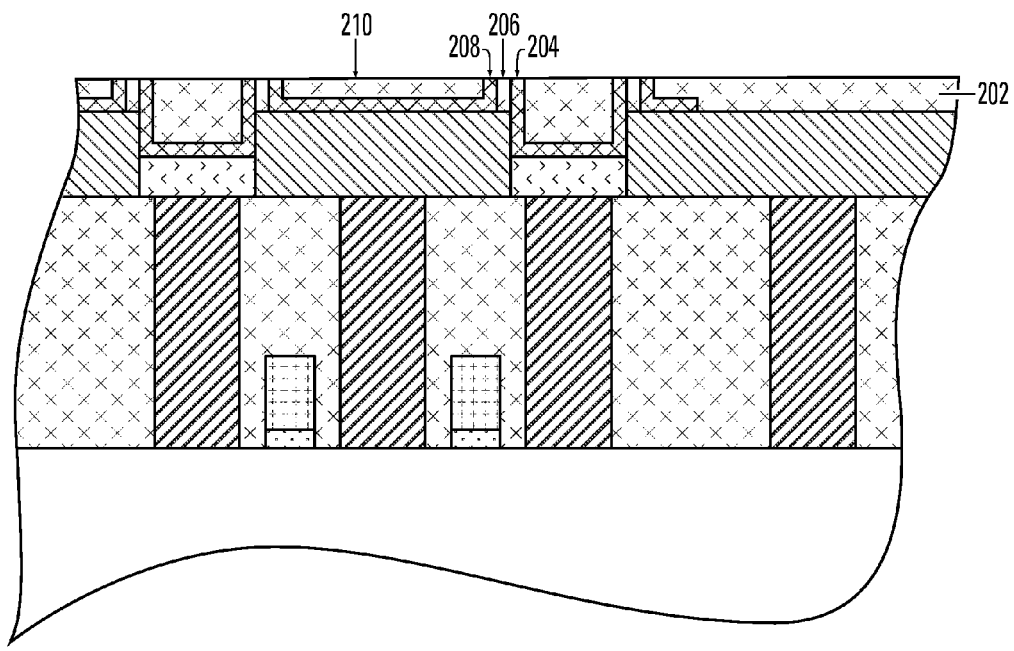

FIG. 12 is a cross section of the portion of the integrated circuit of FIG. 11 after a layer of dielectric material 202, such as silicon dioxide, has been deposited and planarized by a process such as CMP (see FIGS. 4 and 5) to expose surfaces 204, 206, 208 of the first and second spacer layers (compare, FIG. 1, ref. nos. 112, 116, 114), to fill in the cavities (see FIG. 9, ref. nos. 196, 198) and to provide a planarized surface 210 for subsequent processing, including photolithographic patterning.

Figure 13A:
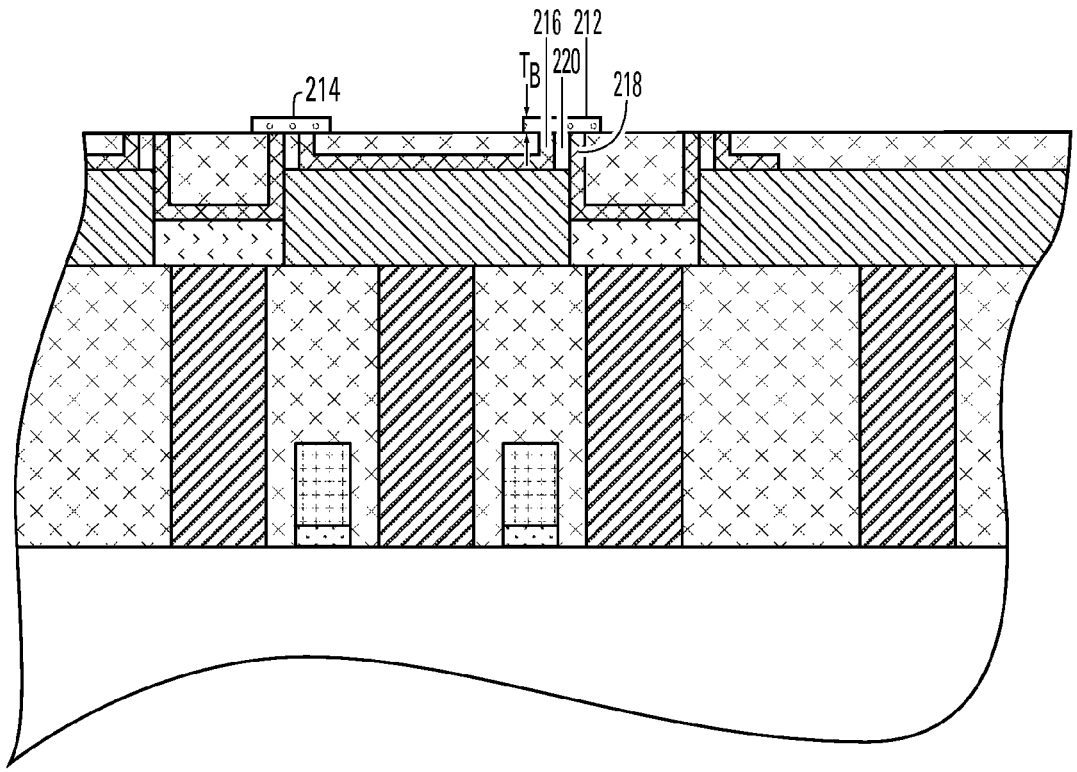

FIG. 13A is a cross section of the portion of the integrated circuit of FIG. 12 after a thin film layer of memory material, such as GST, or other suitable programmable resistive material, has been deposited and patterned to form bridges 212, 214 of memory material (compare, FIG. 1, ref. num. 102). An optional layer of protective material (not shown) such as low temperature deposited SiN, over the GST is formed to protect the GST from subsequent processing steps. The layer of GST is deposited for example by sputtering without collimation at about 250° C., or other deposition technique, after a step to pre-clean top surfaces of the electrode structures. It is desirable that the GST layer be formed as thin as practical for the purpose of limiting the magnitude of the reset current needed for changing the phase of the material. In FIG. 13A it is a circular shape; however, it could be a rectangular or a square shape.

Bridge 212 connects a first electrode 216 formed from the second spacer layer (see FIG. 10, ref. num. 200) with a second electrode 218 also formed from the second spacer layer across a sidewall insulating member 220 formed from the first spacer layer (see, FIG. 7, ref. num. 186). Similarly, bridge 214 connects electrodes formed from the second spacer layer across a sidewall insulating member formed from the first spacer layer as a sidewall on a sacrificial member (see FIG. 8A, ref. num. 178).

The bridge thickness $T_B$ (y-dimension of cross section) can be very small in embodiments of the memory cell, and the length of the active region can also be very short, according to the thickness of the sidewall insulating member 220. This bridge thickness $T_B$ can be established using a thin film deposition technique on the top surfaces of the first electrode, sidewall insulating member, and second electrode. Thus, embodiments of the memory cell have a bridge thickness $T_B$ about 50 nm or less. Other embodiments of the memory cell have a bridge thickness of about 20 nm or less. In yet other embodiments, the bridge thickness $T_B$ is about 10 nm or less. It will be understood that the bridge thickness $T_B$ can be even smaller than 10 nm, using thin film deposition techniques such as atomic layer deposition and the like, according to the chosen memory materials and the needs of the particular application, so long as the thickness is sufficient for the bridge to perform its purpose as memory element which, for a phase change material, requires a bridge member having an active region having at least two solid phases, reversible by a current or by a voltage applied across the first and second electrodes.

A narrow bridge (i.e. small $T_B$) is desirable to provide small contact areas between the bridge and the electrodes. This helps confine heat generated during a programming or reset operation to the bridge material because electrode materials typically have relatively high thermal conductivity, and larger contact areas would conduct more heat out of the bridge. In an embodiment having a bridge width of 50 nm and an electrode length of 30 nm, a contact area of about 1,500 nm$^2$ is formed. Other embodiments have smaller contact areas.

Figure 13B:
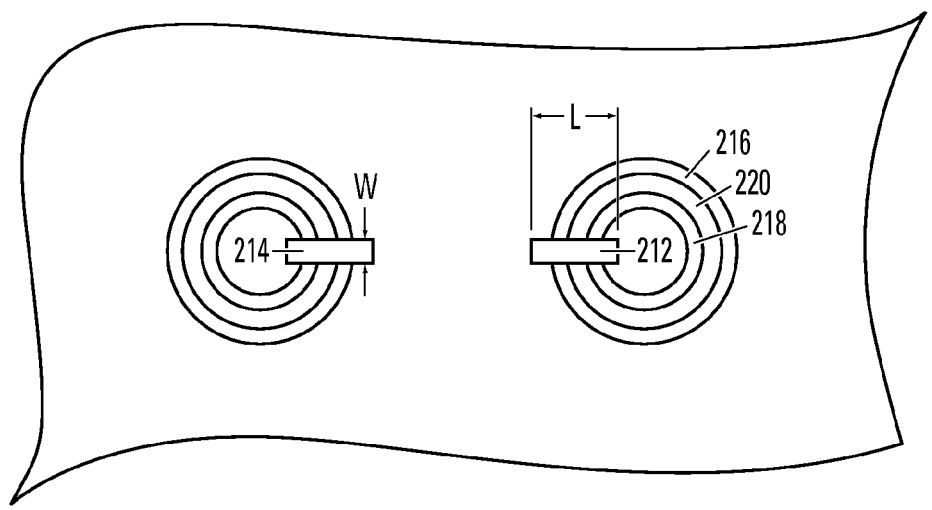

FIG. 13B is a plan view of the portion of the integrated circuit of FIG. 13A. The bridges 212, 214 have a bridge width W that, like the bridge thickness $T_B$, is also very small to reduce the volume of the active region (see FIG. 1, ref. num. 118), and hence reduce the electronic energy used to program and reset the memory cells. This bridge width W is implemented in preferred embodiments, so that it has a width less than 50 nm. In some embodiments, the bridge width W is about 40 nm or less. The bridge length L is sufficient to electrically couple the first electrode 216 to the second electrode 218 across the sidewall insulating member 220, and is between about 30 nm and about 100 nm, preferably about 50 nm, in some embodiments. In some embodiments, the bridge width is patterned using a photoresist ashing technique to reduce the bridge width, which can provide a width less than the minimum photolithographic feature size.

Figure 14:
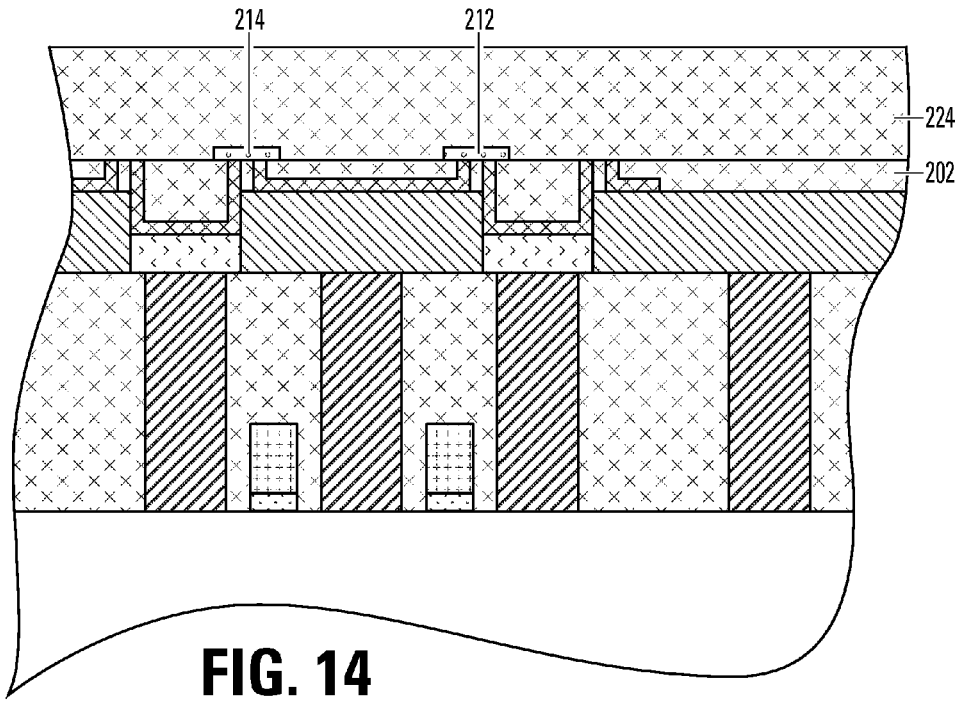

FIG. 14 is a cross section of the portion of the integrated circuit of FIG. 13A with a dielectric fill layer 224 overlying the thin film memory material bridges 212, 214 and dielectric layer 202. After depositing the dielectric fill layer material, the material is planarized using CMP or another process to provide a planar surface for subsequent photolithographic processing. In a particular embodiment, the dielectric fill layer 224 comprises silicon dioxide, a polyimide, silicon nitride or other dielectric fill material. The dielectric layer 202 similarly comprises silicon dioxide, a polyimide, silicon nitride or other dielectric fill material, and may comprise the same dielectric material(s) as the dielectric fill layer 224, or a different dielectric material(s). In embodiments, the dielectric fill layer 224 comprises a relatively good insulator for heat as well as for electricity, providing thermal and electrical isolation for the bridges 212, 214.

Figure 15:
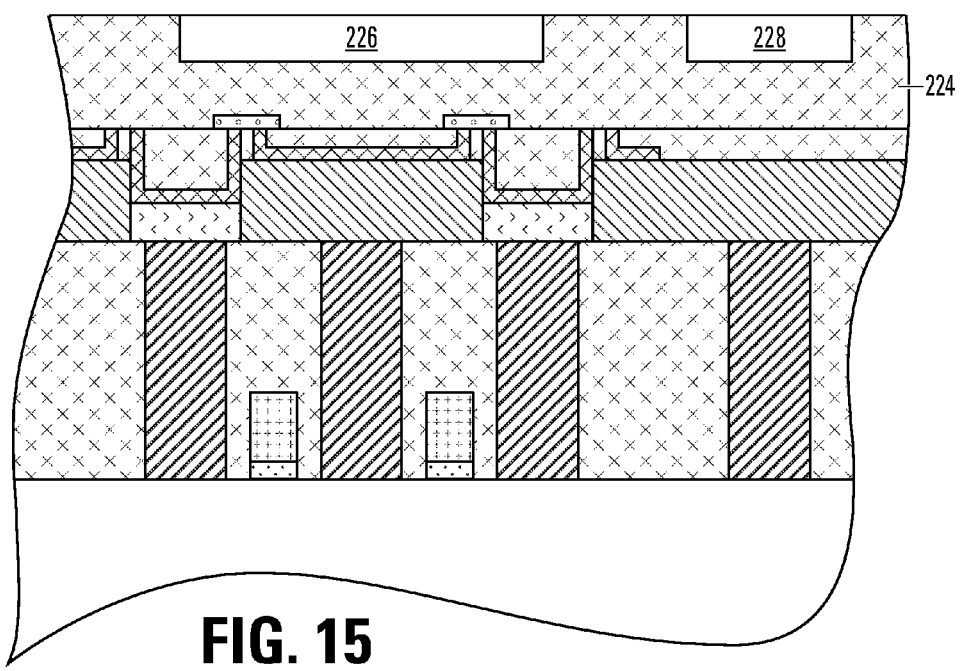

FIG. 15 is a cross section of the portion of the integrated circuit of FIG. 14 with trenches 226, 228 formed in the dielectric fill layer 224 using conventional photolithographic and etch techniques. The trenches will be filled with metal in later steps, as is well known in the art of damascene and dual damascene metallization techniques.

Figure 16:
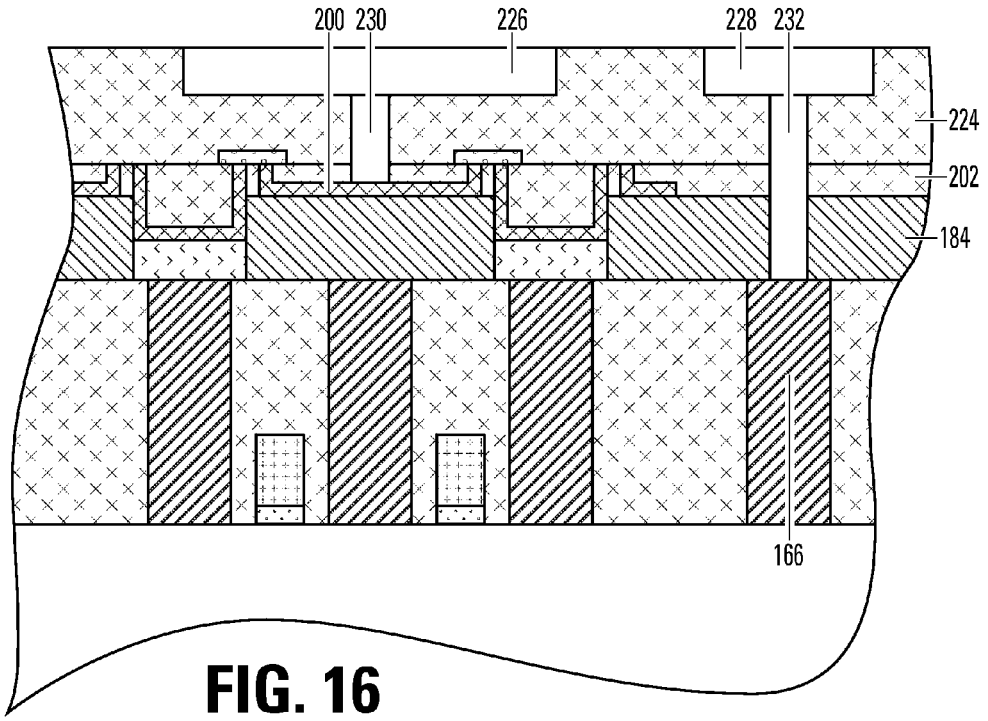

FIG. 16 is a cross section of the portion of the integrated circuit of FIG. 15 with vias 230, 232 extending from the trenches 226, 228 through the dielectric fill layer 224 and the dielectric layer 202 to the second spacer layer 200, which in a particular embodiment is a TiN layer, and the peripheral conductive plug 166, which in a particular embodiment is a tungsten plug. The etch technique used to form the vias selectively etches the material(s) of the dielectric layers 224, 202, 184 without substantially etching the material of the second spacer layer 200, which is relatively thin compared to the conductive plug 166.

Figure 17:
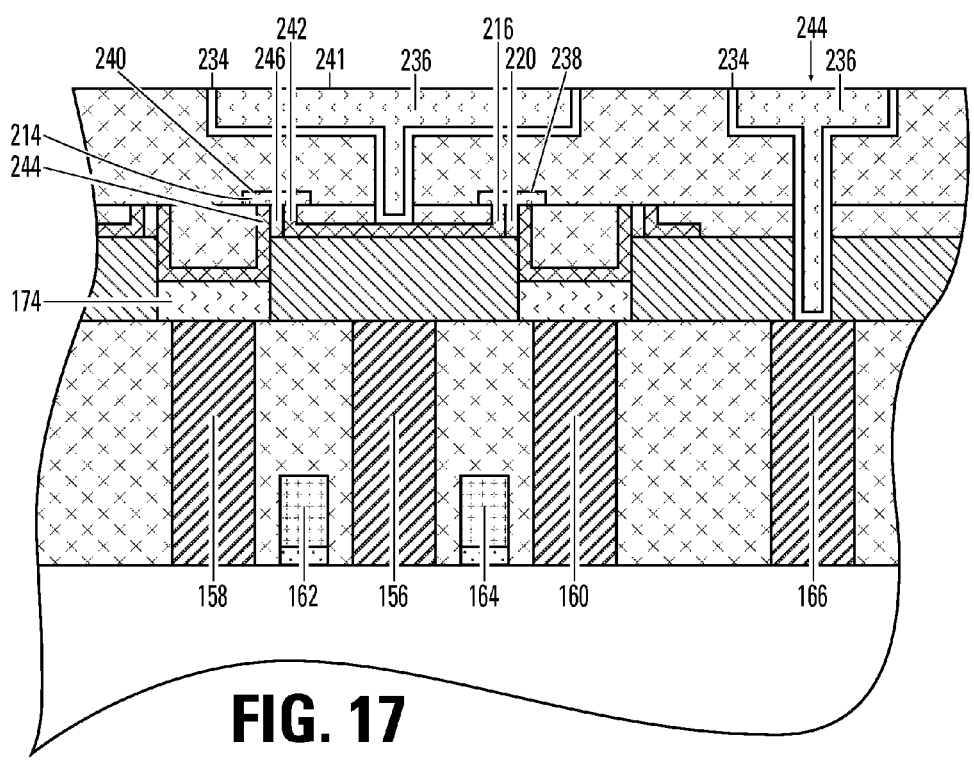

FIG. 17 is a cross section of the portion of the integrated circuit of FIG. 16 after metal patterning. In a particular embodiment, a barrier layer 234 is deposited in the trenches and vias (see FIG. 16, ref. nos. 226, 228, 230, 232), then copper 236 is deposited, and the wafer is CMP'd, as is well known in the art of dual damascene processing. Other metallization techniques, such as single damascene, tungsten plug, and thin film metallization techniques, including patterned metal layers formed prior to depositing the dielectric fill layer, and other metals or other conductors are alternatively used.

Two memory cells 238, 240, corresponding to the thin film bridges of memory material, are shown in this portion of the IC. In operation, the memory cells 238, 240 are accessed by applying a control signal to a bit line 241 formed in the patterned conductive layer. Another control signal is applied to a selected word line, such as a word line that is connected to the gate 162 of the transistor (see FIG. 2A, ref. num. 152) associated with memory cell 240. Thus, individual memory cells (e.g. memory cell 240) are accessed by controlling their associated bit lines and word lines. Memory cells are programmed, read, and reset by applying appropriate signals to their bit lines and word lines, as is well known in the art of electronic memory operation. Other conductive structures, such as peripheral contact 244, contact other electronic terminals of the IC, such as peripheral contact 166.

In operation, access to the memory cell 240 is accomplished by applying a control signal to the word line connected to the gate 162, which couples the common source contact 156 to the drain contact 158, and hence to the conductor portion 174, electrode 244, which is made from the second spacer layer (see FIG. 10, ref. num. 200) and the bridge 214 of memory material, electrode 242, which is also made from the second spacer layer, to the bit line 241. In other words, the bridge provides a current path between the first and second electrodes. Likewise, access to the memory cell 238 is accomplished by applying a control signal to the word line associated with gate 164.

It will be understood that a wide variety of materials can be utilized in implementation of the patterned metal layer in FIG. 17. Other types of metallization, including aluminum, titanium nitride, and tungsten based materials can be utilized as well. Also, non-metal conductive material, such as doped polysilicon, can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The sidewall insulating members 220, 246 may comprise silicon oxide, silicon oxynitride, silicon nitride, $Al_2O_3$, or other low-K dielectrics. Alternatively, the sidewall insulating members may comprise one or more elements selected from the group consisting of Si, Ti, Al, Ta, N, O, and C.

In a particular embodiment, the active region (see FIG. 1, ref. num. 118) of a memory cell has a volume less than or equal to the bridge thickness $T_B$, times the bridge width W, times the sidewall insulating member length (see FIG. 1, ref num. 109). For an embodiment having a bridge thickness of 50 nm, a bridge width of 50 nm, and a sidewall insulating member length of 30 nm, the bridge in a memory cell has a volume of about 75,000 $nm^3$. In another embodiment having a bridge thickness of 10 nm, a bridge width of 40 nm, and a sidewall insulating member length of 20 nm, the active region of a bridge in a memory cell has a volume of about 8,000 $nm^3$.

Figure 18:
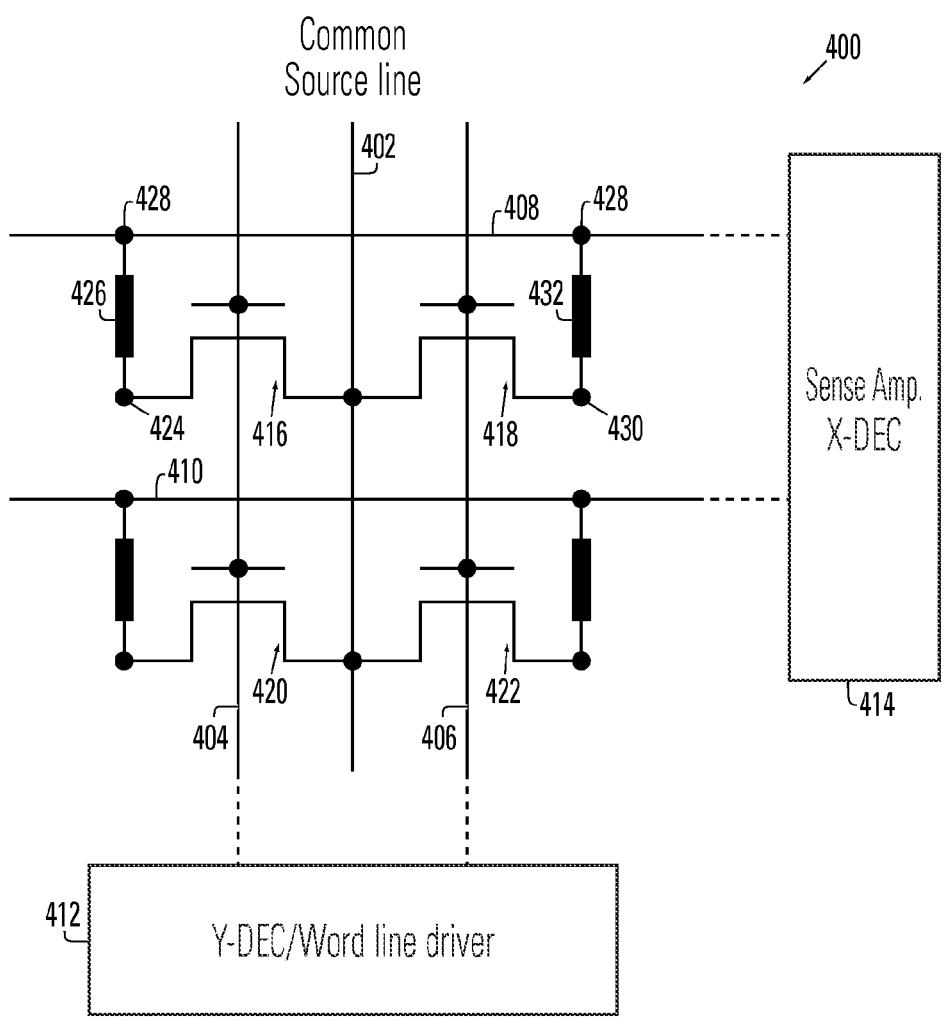
FIG. 18 is a schematic diagram for a memory array comprising phase change memory elements according to an embodiment.

FIG. 18 is a schematic illustration of a memory array 400, which can be implemented using memory cells as described with reference to FIGS. 1, 14 and 15, or with other memory cells according to embodiments. In a schematic illustration of FIG. 16, the common source line 402, the word line 404 and the word line 406 are arranged generally parallel in the y-direction. Bit lines 408, 410 are arranged generally parallel in the x-direction. Thus, a y-decoder and a word line driver in block 412 are coupled to the word lines 404, 406. An x-decoder and set of sense amplifiers in block 414 are coupled to the bit lines 408, 410. The common source line 402 is coupled to the source terminals of access transistors 416, 418, 420, 422. The gate of access transistor 416 is coupled to the word line 404. The gate of access transistor 418 is coupled to the word line 406. The gate of access transistor 420 is coupled to the word line 404. The gate of access transistor 422 is coupled to the word line 406. The drain of access transistor 416 is coupled to the electrode member 424 for memory cell 426, which is in turn coupled to electrode member 428. Likewise, the drain of access transistor 418 is coupled to the electrode member 430 for memory cell 432, which is in turn coupled to the electrode member 428. Memory cells 426, 432 have bridges of memory material with reduced electrode contact areas and a reduced active region length provided by first and second sidewall layers.

The electrode member 428 is coupled to the bit line 408. For schematic purposes, the electrode member 428 is illustrated at separate locations on the bit line 408. It will be appreciated that separate electrode members can be utilized for the separate memory cell bridges in other embodiments. Access transistors 420, 422 are coupled to corresponding memory cells as well on line 410. It can be seen that the common source line 402 is shared by two rows of memory cells, where a row is arranged in the y-direction in the illustrated schematic. Likewise, the electrode member 428 is shared by two memory cells in a column in the array, where a column is arranged in the x-direction in the illustrated schematic.

Figure 19:
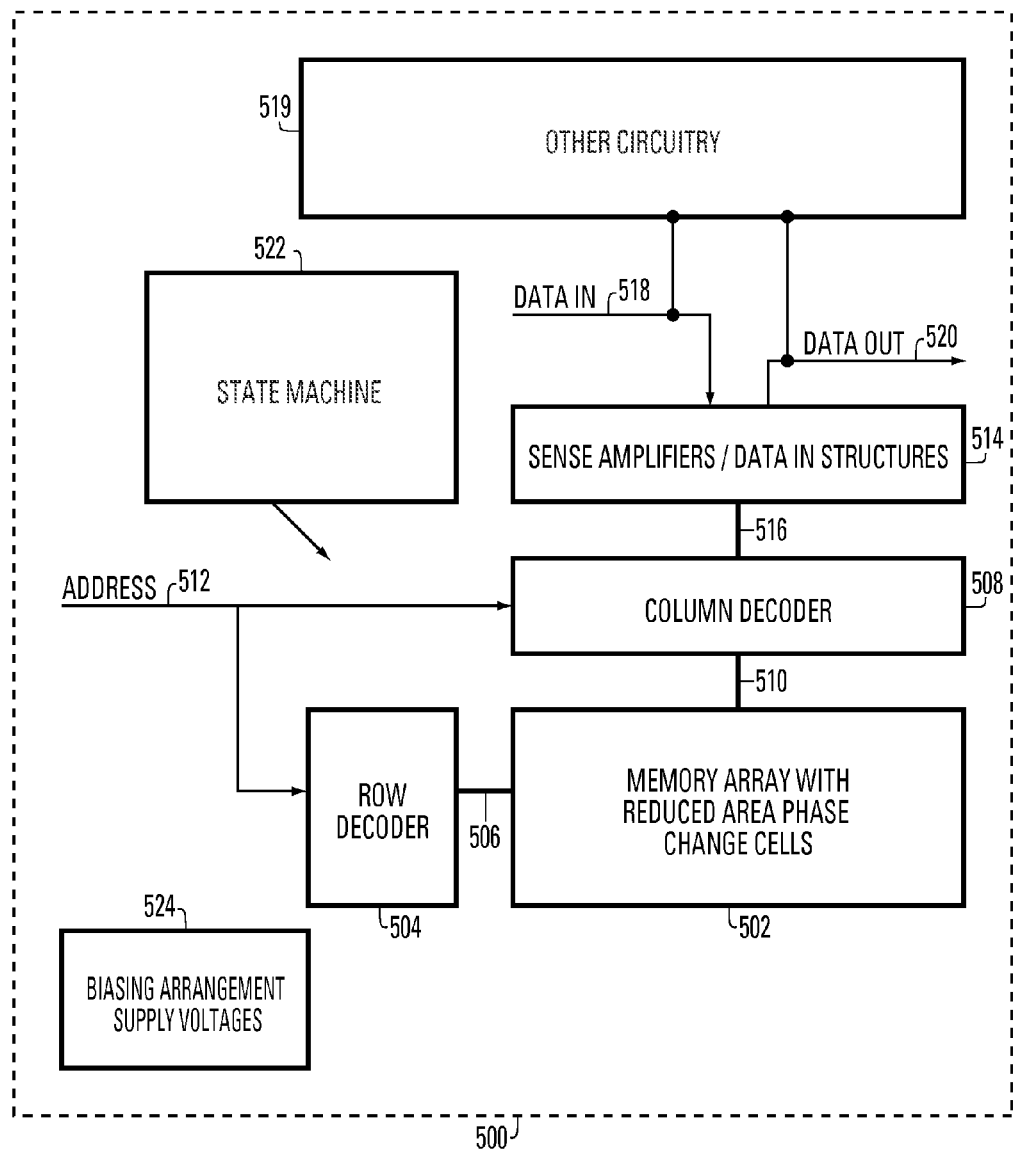
FIG. 19 is a block diagram of an integrated circuit device including a phase change memory array according to an embodiment.

FIG. 19 is a simplified block diagram of an integrated circuit 500 according to an embodiment of the present invention. The integrated circuit 500 includes a memory array 502 implemented using thin film fuse phase change memory cells having reduced electrode contact areas and a reduced active region length, on a semiconductor substrate. A row decoder 504 is coupled to a plurality of word lines 506, and arranged along rows in the memory array 502. A column decoder 508 is coupled to a plurality of bit lines 510 arranged along columns in the memory array 502 for reading and programming data from the phase change memory cells in the memory array 502. Addresses are supplied on bus 512 to column decoder 508 and row decoder 504. Sense amplifiers and data-in structures in block 514 are coupled to the column decoder 508 via data bus 516. Data is supplied via the data-in line 518 from input/output ports on the integrated circuit 500 or from other data sources internal (e.g. other circuitry 519) or external to the integrated circuit 500, to the data-in structures in block 514. In the illustrated embodiment, other circuitry 519 is included on the integrated circuit, such as a general purpose processor or special purpose application circuitry, or a combination of modules providing system-on-a-chip functionality supported by the thin film fuse phase change memory cell array. Data is supplied via the data-out line 520 from the sense amplifiers in block 514 to input/output ports on the integrated circuit 500, or to other data destinations internal or external to the integrated circuit 500.

A controller implemented in this example using bias arrangement state machine 522 controls the application of bias arrangement supply voltages 524, such as read, program, erase, erase verify and program verify voltages. The controller can be implemented using special purpose logic circuitry as known in the art. In alternative embodiments, the controller comprises a general purpose processor, which may be implemented on the same integrated circuit, which executes a computer program to control the operations of the device. In yet other embodiments, a combination of special purpose logic circuitry and a general purpose processor may be utilized for implementation of the controller.

Advantages of an embodiment described herein include reduced electrode contact areas, which results in less heat being drawn away from the active region during programming and resetting operations because the electrically conductive material of the electrodes is also usually a relatively good thermal conductor, and a reduced active region length, which concentrates the heat generated during programming and resetting operations in a smaller volume, providing improved reliability and lower set/reset power levels.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A memory device, comprising:
an insulating sidewall;
a first electrode including a first electrode sidewall;
a second electrode including a second electrode sidewall being concentric with the first electrode sidewall and separated from the first electrode sidewall by the insulating sidewall;
a bridge having a bridge width, the bridge extending from a top surface of the first electrode sidewall to a top surface of the second electrode sidewall across a top surface of the insulating sidewall, wherein the bridge comprises memory material, an inter-electrode current path through the memory material having an active region, between the first and second electrodes having a path length defined by a thickness of the insulating sidewall, and contact areas between the top surfaces of the first and second electrode sidewalls and the memory material are defined by thicknesses of the first and second electrode sidewalls and the bridge width.

2. The device of claim 1, wherein the thickness of the first and second electrode sidewalls are each less than 30 nm.

3. The device of claim 1, wherein the thickness of the insulating sidewall is less than 30 nm.

4. The device of claim 1, wherein the bridge comprises a thin film having a bridge length less than 100 nm, a thickness 30 nm or less, and a width 50 nm or less, and wherein the thickness of the first electrode sidewall is less than 30 nm and the thickness of the second electrode sidewall is less than 30 nm.

5. The device of claim 1, wherein the bridge has a volume between 8,000 $nm^3$ and 75,000 $nm^3$.

6. The device of claim 1, wherein the bridge comprises a thin film with a thickness 10 nm or less and a width 40 nm or less.

7. The device of claim 1, wherein the memory material has at least two solid phases reversibly inducible by an electric current.

8. The device of claim 1, wherein the memory material has at least two solid phases reversibly inducible by a voltage applied between the first electrode and the second electrode.

9. The device of claim 1, wherein the memory material has at least two solid phases, including a generally amorphous phase and a generally crystalline phase.

10. The device of claim 1, wherein the insulating sidewall comprises silicon nitride.

11. The device of claim 1, wherein the thickness of the first electrode sidewall is equal to the thickness of the second electrode sidewall.

12. The device of claim 1, wherein the bridge has a width less than a minimum lithographic feature size of a lithographic process used to form the device.

13. The device of claim 1, wherein the contact area between the first electrode sidewall and the bridge is not greater than 1,500 $nm^2$.

14. The device of claim 1, wherein the bridge comprises an alloy including a combination of Ge, Sb, and Te.

15. The device of claim 1, wherein the bridge comprises an alloy including a combination of two or more materials from the group of Ge, Sb, Te, Se, In, Ti, Ga, Bi, Sn, Cu, Pd, Pb, Ag, S, and Au.

16. The device of claim 1, wherein the first and second electrodes comprise an element selected from a group consisting of Ti, W, Mo, Al, Ta, Cu, Pt, Ir, La, Ni, and Ru and alloys thereof.

17. The device of claim 1, wherein the first and second electrodes comprise Ti and N.

18. The device of claim 1, wherein the first and second electrodes comprise Ta and N.

19. The device of claim 1, wherein the active region is spaced away from the top surfaces of the first and second electrode sidewalls.

* * * * *